United States Patent [19]

Daigle et al.

[11] Patent Number: 5,046,238
[45] Date of Patent: Sep. 10, 1991

[54] METHOD OF MANUFACTURING A MULTILAYER CIRCUIT BOARD

[75] Inventors: Robert Daigle, Sterling; Samuel Malbaurn, Dayville, both of Conn.; David Noddin, Eau Claire, Wis.; G. Robert Traut, Danielson, Ct.

[73] Assignee: Rogers Corporation, Rogers, Conn.

[21] Appl. No.: 493,975

[22] Filed: Mar. 15, 1990

[51] Int. Cl.$^5$ .............................................. H05K 3/36
[52] U.S. Cl. ........................................ 29/830; 29/739; 29/848; 361/412; 428/422
[58] Field of Search ............... 204/15; 29/830, 739, 29/846; 361/412, 414

[56] References Cited

U.S. PATENT DOCUMENTS

| | | | |
|---|---|---|---|
| 3,835,531 | 9/1974 | Luttmer | 29/830 X |
| 4,634,631 | 1/1987 | Gazit et al. | 428/422 X |
| 4,788,766 | 12/1988 | Burger et al. | 29/848 X |
| 4,818,728 | 4/1989 | Rai et al. | 29/739 X |
| 4,868,350 | 9/1989 | Hoffarth et al. | 29/830 X |

OTHER PUBLICATIONS

IBM Tech Disclosure Bull., vol. 11, No. 8, Jan. 1969. p. 962, by K. Hermann.
IBM Tech. Disclosure Bull., vol. 12, No. 8, Jan. 1970. pp. 1191-1192, by Haddad.

Primary Examiner—Carl J. Arbes
Attorney, Agent, or Firm—Fishman, Dionne & Cantor

[57] ABSTRACT

Methods of fabricating multilayer circuits are presented. In accordance with the present invention, a plurality of circuit layers comprised of a dielectric substrate having a circuit formed thereon are stacked, one on top of the other. The dielectric substrate is composed of a polymeric material capable of undergoing fusion bonding such as a fluoropolymeric based substrate. Fusible conductive bonding material (e.g. solder) is applied on selected exposed circuit traces (prior to the stacking step) whereupon the entire stack-up is subjected to lamination under heat and pressure to simultaneously fuse all of the substrate and conductive layers together to form an integral multilayer circuit having solid conductive interconnects.

12 Claims, 4 Drawing Sheets

METHOD OF MANUFACTURING A MULTILAYER CIRCUIT BOARD

BACKGROUND OF THE INVENTION

This invention relates generally to methods of manufacturing multilayer circuit board and multichip modules. More particularly, this invention relates to new and improved methods of manufacturing multilayer circuits wherein interconnections between circuit layers may be accomplished in a single fusion bonding lamination step utilizing fusible conductive material. In a preferred embodiment, this fusion bonding is accomplished without the need for intermediate bonding plys.

Multilayer circuits are well known and comprise a plurality of stacked substrate/circuit trace assemblies with interconnections between selected locations on the spaced circuit traces. These circuits are often configured as stripline or microstrip circuits and find particular utility in microwave antenna and other microwave applications. These circuits are also used in the manufacture of miltichip modules. Conventional manufacturing techniques for multilayer circuits sometimes require multiple bonding cycles to make the completed assembly. Once the substrates have been bonded together, via holes are drilled completely through the bonded assembly and plated for transferring electrical connections between different layers. This limits the circuit density and the number of substrates. The bonding material, which may comprise a bonding film between the substrates, tends to flow out of the assembly under the influence of the high temperature and pressure. As more and more of the bonding material flows out, the pressure is transferred to the plated holes which may collapse and/or be pushed into the substrate which has been softened by the high temperature.

U.S. Pat. No. 4,788,766 attempts to overcome these problems. This prior patent discloses a method wherein a multilayer assembly is made up of a number of individual circuit boards and each board has a substrate on which a first conductive layer is formed on the opposite surface. The substrate is a dielectric material which insulates the conductive layers. Via holes are formed through the first conductive layer, the substrate and the second conductive layer at various locations. An outer conductive material, such as copper, is applied over the first and second conductive bonding layers and onto the side walls of the holes. A conductive bonding material is then deposited onto the outer conductive material in the areas around the holes. Once the individual boards have been fabricated, they are stacked in a predetermined order and orientation with a suitable low temperature dielectric bonding ply (meaning that the bonding ply has a lower softening temperature than the circuit substrate material) positioned between each pair of layers. The dielectric bonding ply requires registered apertures therethrough which correspond to areas where the conductive layer of one substrate is to make an electrically conductive connection with the conductive layer of an adjacent substrate. Thus, the dielectric bonding ply integrally bonds adjacent boards together while providing electrical isolation and/or electrical connections between conductive layers of the different boards. The assembly of boards is then subjected to a cycle of heat and pressure to effect a bond between the various board layers.

While the method of U.S. Pat. 4,788,766 overcomes some of the problems in the prior art, this prior method has certain disadvantages including the requirement for a substrate which has a melting temperature above the melting temperature of the bonding ply. In other words, the prior patent necessitates the use of a low temperature bond ply which limits the thermal rating of the multi-layer circuit. In addition, this prior method necessitates registered apertures in the bonding ply (leading to alignment problems) and is limited to multilayer circuits having plated through holes.

SUMMARY OF THE INVENTION

The above-discussed and other problems and deficiencies of the prior art are overcome or alleviated by the methods of fabricating multilayer circuits of the present invention. In accordance with the present invention, a plurality of circuit layers comprised of a dielectric substrate having a circuit formed thereon are stacked, one on top of the other. The dielectric substrate is composed of a polymeric material capable of undergoing fusion bonding such as a fluoropolymeric based substrate. Fusible conductive bonding material (e.g. solder) is applied on selected exposed circuit traces (prior to the stacking step) whereupon the entire stack-up is subjected to lamination under heat and pressure to simultaneously fuse all of the substrate and conductive layers together to form an integral multilayer circuit having solid conductive interconnects.

In a first embodiment of the present invention, the discrete circuit layers are each prepared by (1) forming traces and pads on a removable mandrel; (2) laminating a layer of dielectric to the circuit and mandrel; (3) forming an access opening at selected locations through the dielectric layer (using laser, plasma, ion etch or mechanical drilling techniques) to expose selected circuit locations; (4) forming conductive posts in the access openings to a level below the top of the access openings; and (5) providing a fusible conductive material in the access opening. Thereafter, a stack-up is made of a plurality of these discrete circuit layers so that the exposed fusible conductive material contacts selected locations on an adjacent circuit. This stack-up is then subjected to heat and pressure to simultaneously fuse both the several layers of dielectric substrate and fusible conductive material to provide a cohesive fused multilayer circuit board.

In a second embodiment of this invention, at least one discrete circuit board is made using any suitable technique to define a fusible dielectric substrate having a circuit pattern thereon. Next, a layer of fusible dielectric material having openings through selected locations is placed on the circuit board so that selected locations on the circuit pattern are exposed. Thereafter, a plug of fusible conductive material (e.g. solder) is placed in the openings (using manual, mechanical or like techniques). Next, a second circuit board is stacked on the first board so that the plugs of fusible conductive material align with and contact selected locations on the circuit pattern of the second circuit board. This stack-up is then subjected to heat and pressure to simultaneously fuse both the layers of fusible dielectric and the fusible conductive material to provide a cohesive fused multilayer circuit board.

All of the foregoing embodiments provide important features and advantages relative to prior art multilayer circuit fabrication techniques including lower manufacturing costs and increased circuit density.

The above-discussed and other features and advantages of the present invention will be appreciated and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

The present invention relates generally to methods of interconnecting individual layers of a multichip module or multilayer circuit board using fused polymer composite bonding. All of the inner layers of the circuit boards are interconnected using fusible metal posts or the like to achieve solid conductive interconnects. These fusible posts can be composed entirely of fusible conductive material or a combination of non-fusible and fusible conductive materials. The fusible conductive material may be introduced into the multilayer circuits using any number of techniques which will be described below. In addition, the present invention generally utilizes a fusible dielectric substrate which fuses with adjacent layers of dielectric substrate concurrently with the fusible conductive metal.

Examples of suitable fusible dielectric substrates include fluoropolymer based substrate materials such as PTFE or the fluoropolymeric, substrates described in U.S. Pat. Nos. 4,335,180; 4,634,631, 4,647,508 or 4,849,284 (all of which are assigned to the assignee hereof and fully incorporated herein by reference). Examples of commercially available dielectric substrates suitable for the present invention include the materials sold under the tradenames RT/DUROID and RO-2800, both of which are available from Rogers Corporation, assignee of the present application. Examples of suitable fusible conductive material includes metals and metal alloys with a melting point of less than 900° F. A specific example of such a fusible material is a solder composition of 60% tin and 40% lead.

Figure 1:
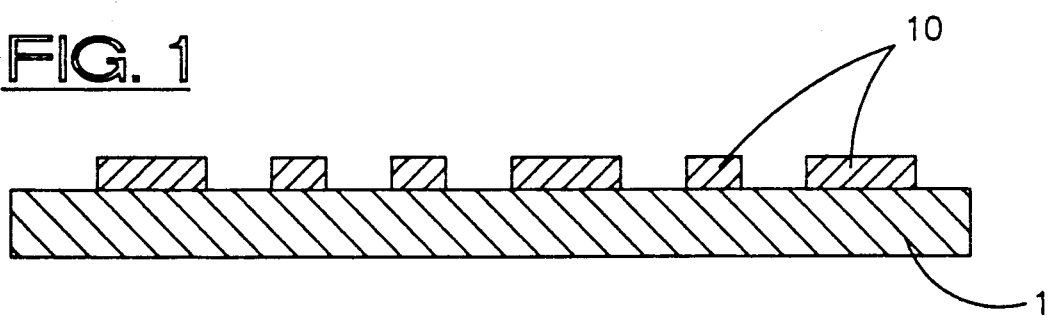
FIGS. 1-5 are sequential cross-sectional elevational views showing the fabrication of a discrete circuit board layer in accordance with the first embodiment of the present invention.
Figure 2:
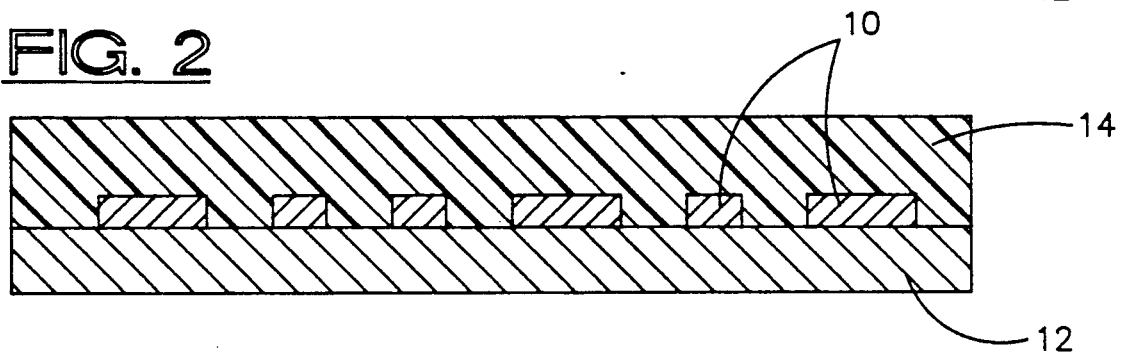
Figure 3:
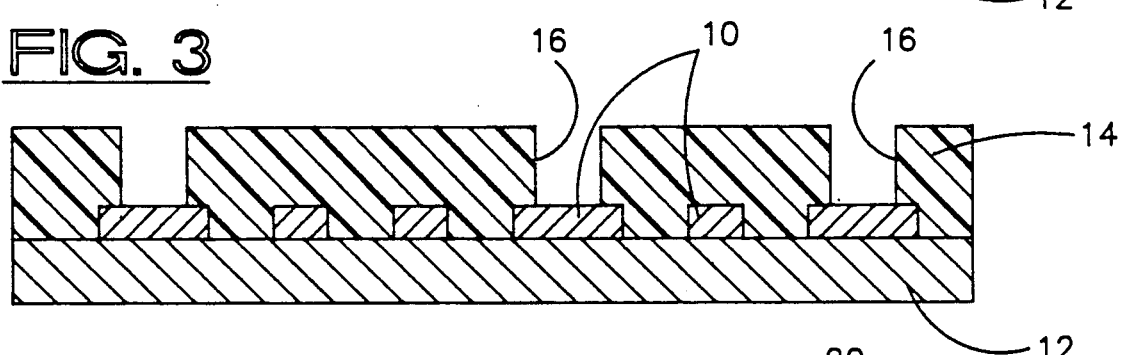
Figure 4:
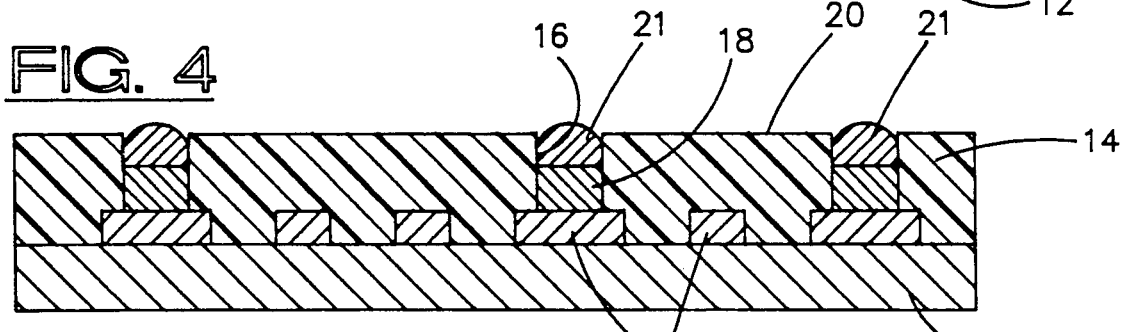
Figure 5:
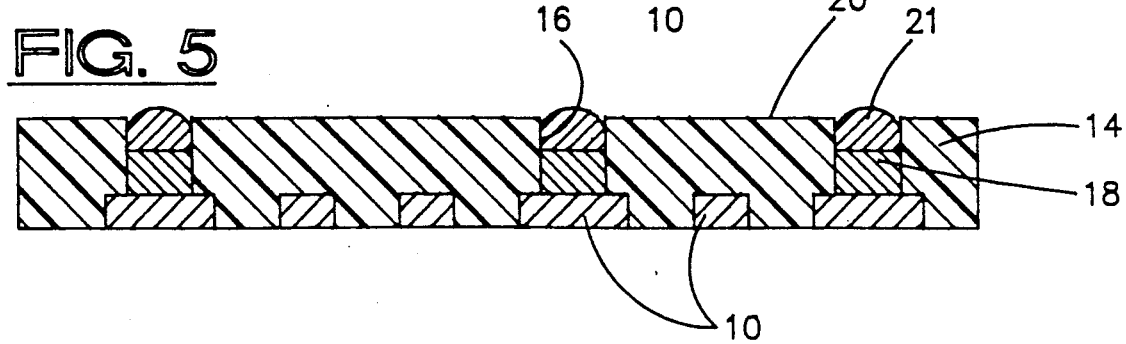

Turning now to FIGS. 1-7, a first embodiment of the present invention will now be described. In the first step shown in FIG. 1, a pattern of 10 of circuit traces and pads is formed on suitable mandrel 12. The pattern may be comprised of any suitable conductive material such as copper or aluminum and may be formed on mandrel 12 by any suitable method such as electroless plating, electroplating or vapor deposition. Mandrel 12 is preferably comprised of copper or other metal. Next, as shown in FIG. 2, a layer of dielectric material 14 is laminated over circuit 10 and mandrel 12. Thereafter, access openings 16 are provided through dielectric layer 14 at selected locations to access the pads or traces 10 (see FIG. 3). Access openings 16 may be formed using any known means such as laser, plasma, ion etch or mechanical drilling techniques. One particularly well suited technique is the laser etching methodology described in U.S. application Ser. No. 231,693 filed Aug. 12, 1988 (now U.S. Pat. No. 4,915,981) which is assigned to the assignee hereof and incorporated herein by reference.

After the access openings 16 has been formed (see FIG. 4), conductive posts 18 are formed within access openings 16 so as to completely fill openings 16 to a level just below the top surface 20 of dielectric layer 14. Still referring to FIG. 4, in the next step, a conductive fusible material such as solder is disposed in the remaining portion of access opening 16 so as either to be level with top surface 20 or extend slightly thereover. In the final step of forming a discrete circuit layer, the mandrel 12 is removed from the circuit and dielectric using any suitable removal methods such as known etching techniques. The final discrete circuit layer is thus shown a 22 in FIG. 5.

Figure 6:
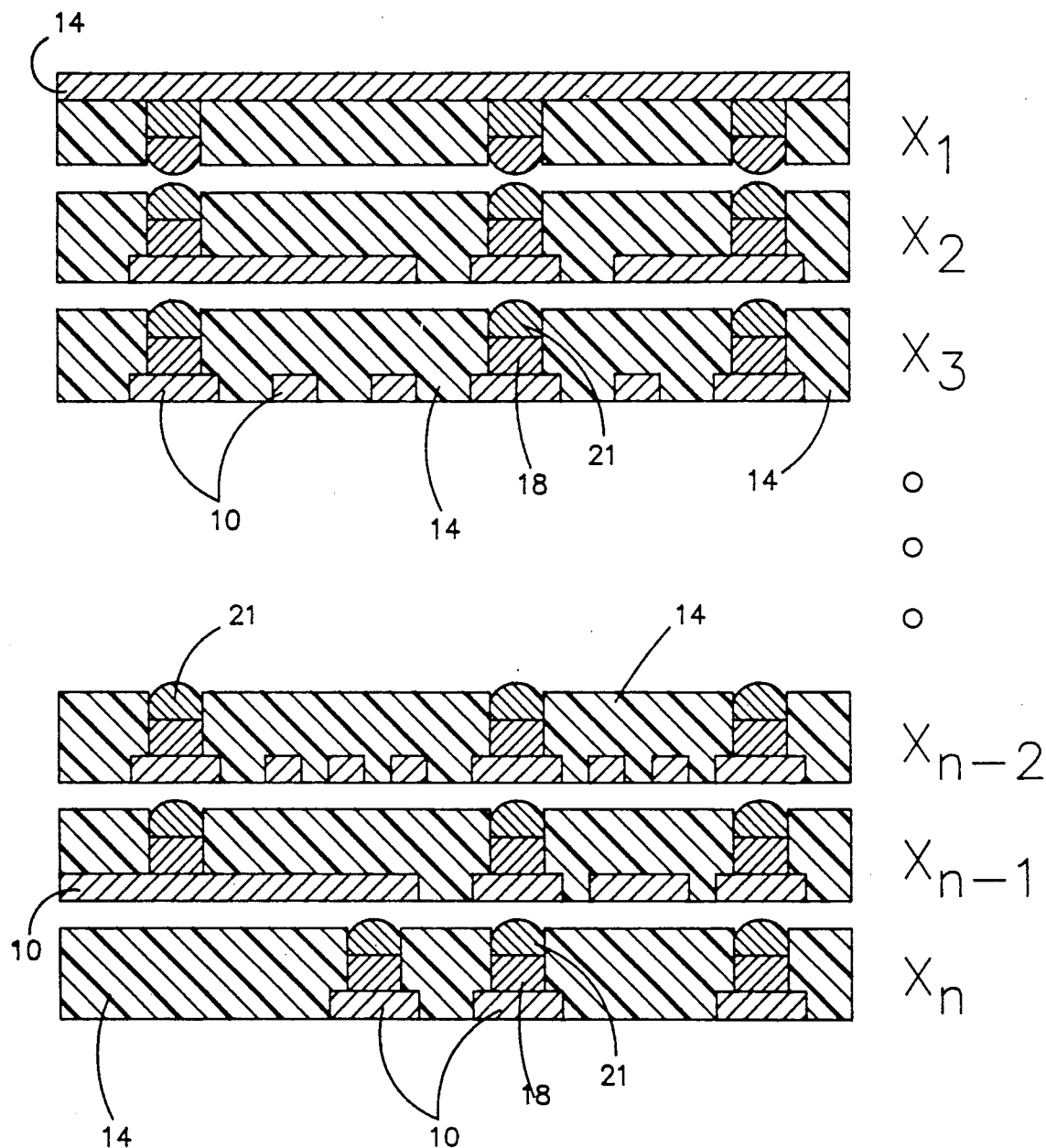
FIG. 6 is an exploded view depicting a stack-up of circuit boards of the type shown in FIG. 5.

Turning now to FIG. 6, a plurality of circuits 22 which have been fabricated in accordance with the techniques shown in FIGS. 1-5 are stacked one on top of the other in the manner shown. Of course, any number ($X_n$) of circuit substrates 22 may be stacked and registered with one another such that the fusible conductive material 21 aligns with a selective location on an adjacent circuit pad or trace 10.

After the discrete circuit boards have been stacked up as shown in FIG. 6, the stack up is subjected to lamination under sufficient heat and pressure so as to simultaneously fuse the dielectric substrate 14 and the fusible conductive material 21 and thereby provide an integral and cohesive fused multilayer circuit board 26 having solid conductive interconnects.

Figure 7:
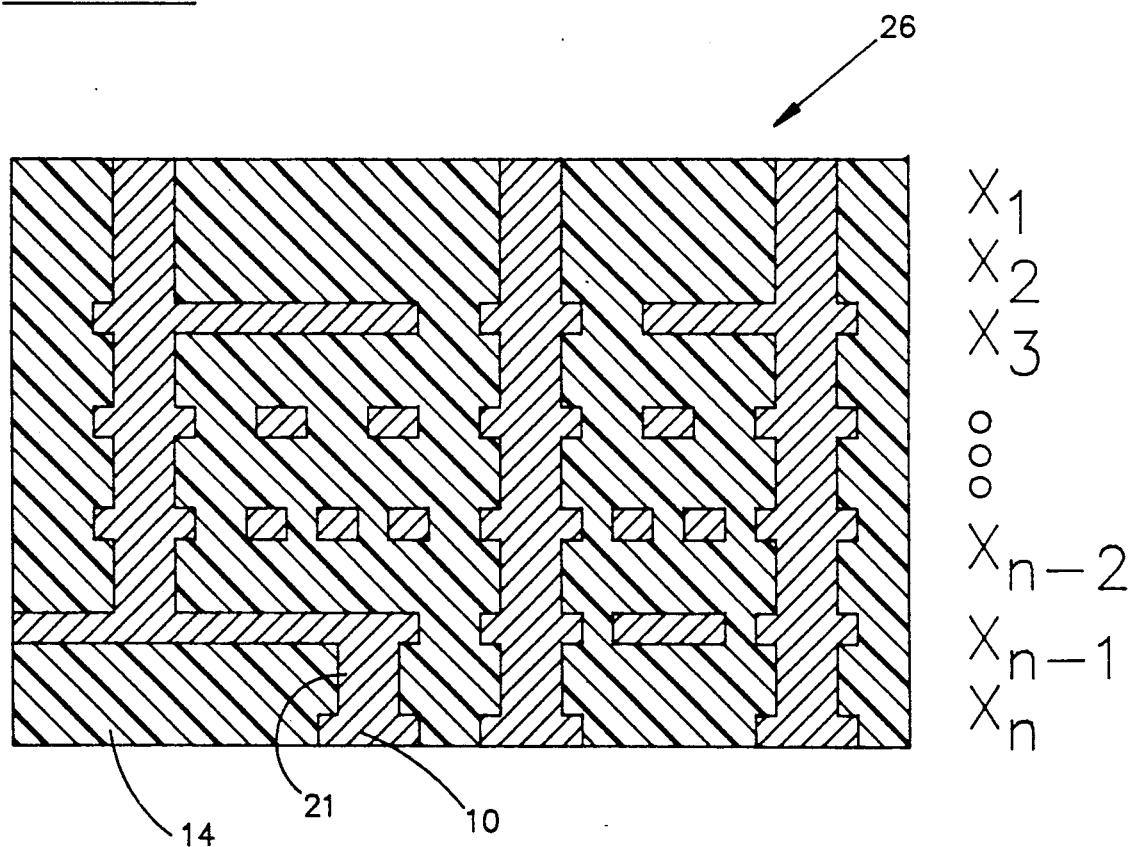
FIG. 7 is a cross sectional elevation view of a final laminated multilayer circuit board made in accordance with the first embodiment of the present invention.

It will be appreciated that several alternative method steps may be utilized in conjunction with the first embodiment of this invention. For example, rather than the additive processing techniques for formation of the circuit traces shown in FIGURES 1-5, known substractive imaging technology may be used to form circuits 10. Also, the fusible interconnect material may be deposited by any known method such as screen printing or by using any other suitable selective placement technology. In addition, an intermediate bonding film having access openings selectively formed therein may be utilized between discrete circuit layers 22. This intermediate bonding film would include the fusible conductive material therein so that upon lamination under heat and pressure, a final multilayer circuit such as shown in FIG. 7 would result. In still another alternative, the entire access opening 16 may be filled with the fusible conductive material.

Figure 10:
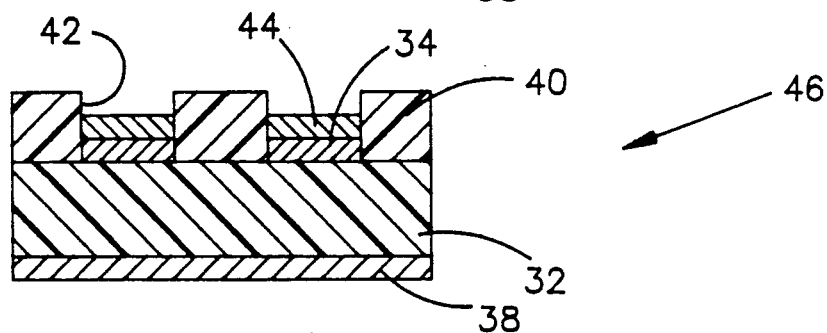

Turning now to FIGS. 8-12, a second embodiment in accordance with the present invention is shown. In this second embodiment, a circuit board shown generally at 30 is formed using any known processes. Circuit board 30 includes a dielectric substrate 32 comprised of a fusible polymeric material and a pattern of circuit traces and pads 34 on a top surface 36 of substrate 32. An optional conductive layer 38 may be provided on the bottom surface of substrate 32 for shielding or other purposes. In the next step shown in FIG. 9, a layer of fusible dielectric material 40 is provided onto top surface 36 of dielectric layer 32. Layer 40 will include preselected registered openings 42 therethrough which correspond to preselected locations on circuit traces 34. Alternatively, layer 40 may be positioned over circuit 30 with openings 42 formed "in situ" using laser etching or other techniques. Thereafter, fusible conductive plugs 44 are loaded in openings 42 adjacent selected contacts and pads 34 (FIG. 10). Conductive plugs 44 may be positioned within openings 42 using any suitable manual or mechanical means resulting in the circuit assembly identified at 46 in FIG. 10.

Figure 11:
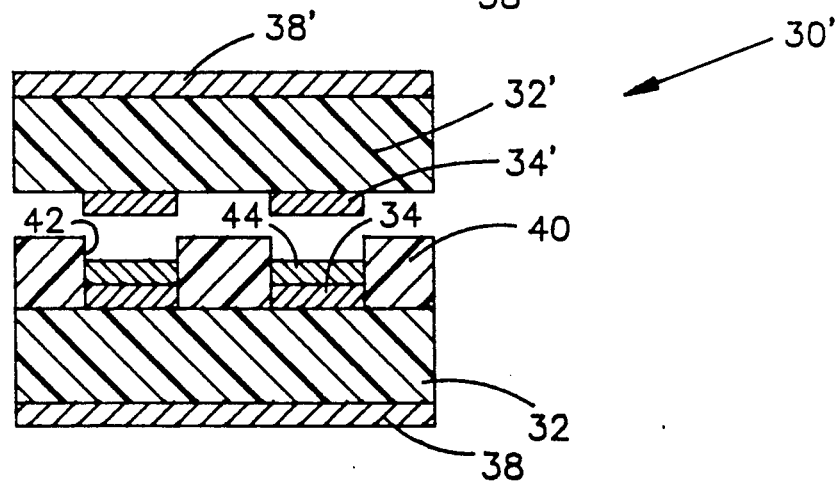
Figure 12:
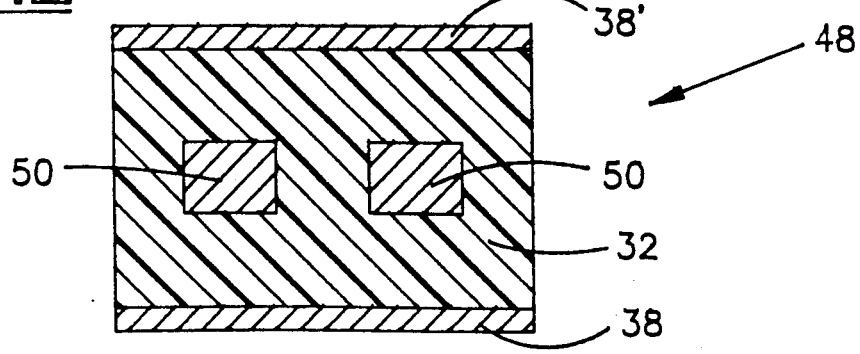

Next, and as shown in FIG. 11, a second circuit 30' is disposed over circuit assembly 46 such that circuits 34' are aligned with and contact fusible conductive material 44. The stack-up in FIG. 11 is then subjected to fusion lamination as described above resulting in the fusion of conductive materials 44 with circuits 34 and 34', and the fusion of the dielectric layers 32, 32' and 40 to provide a cohesive multilayer circuit board 48 having solid conductive interconnects 50 (see FIG. 12). It will be appreciated that as in the first embodiment, any number of circuits 46 may be stacked to form any desired multilayer circuit configuration.

For both the first and second embodiments of this invention, lamination temperatures and pressures will vary with the composition of the fusible dielectric and conductive material. The following or examples describing both the first embodiment (Example 1) and the second embodiment (Example 2).

Example 1

A stack-up of six discrete circuits was made in accordance with the first embodiment of this invention. The fusible dielectric was the fluoropolymer of U.S. Pat. 4,849,284 and the fusible conductive material was solder (having a composition of 60% tin and 40% lead). The lamination temperature was 700° F. and pressure was 250 psi for a one hour cycle time in order to produce fusion bonding and a cohesive multilayer circuit laminate.

Example 2

Figure 8:
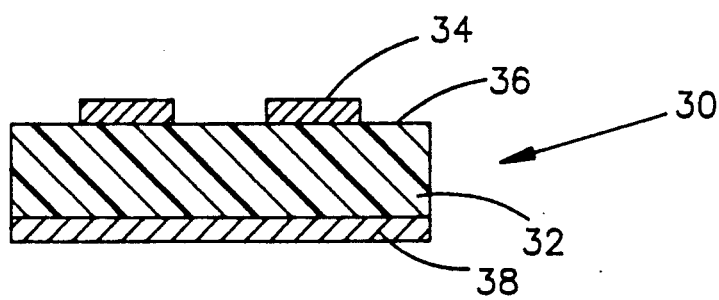
FIGS. 8-12 are cross sectional elevation views depicting a sequential fabrication technique for making multilayer circuit boards in accordance with the second embodiment of the present invention.
Figure 9:
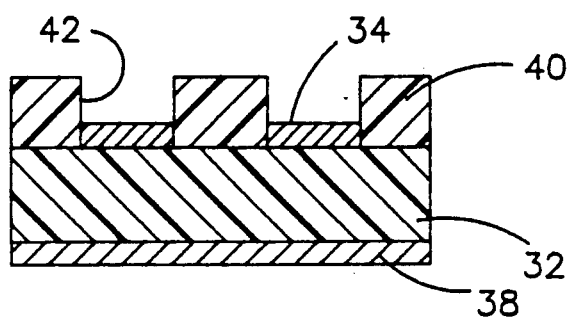

A circuit laminate with circuit features subtractively defined was prepared as in FIG. 8. The fusible substrate was the material described in U.S. Pat. 4,849,284 and sold commercially under the trademark RO-2800 by Rogers Corporation. Next, a layer of bonding ply with apertures defined in the areas where fusible interconnects were to be formed was registered to these circuit features and layed up as in FIG. 9. The bonding ply was the material sold by Rogers Corporation under the trademark RO-2810. Solder Plugs (approximately ⅛" in diameter) having a 3% tin, 97% lead composition were then placed in the apertures as in FIG. 10. Another circuit laminate was then registered to the tooled bond ply and layed up as shown in FIG. 11. The stack-up was then laminated at 730°F. and 250 psi for one hour with the dielectric and solder materials separately fusing to form a cohesive multilayer interconnect structure. The circuit material in both Examples 1 and 2 were copper.

In general, the fusion bonding will take place in a temperature range of between the melting point of the fusible dielectric and the degradation temperature of the fusible dielectric. When using a PTFE fluoropolymer based substrate, this temperature range will be between 620° F. and 800° F. A preferred pressure range is between 250 to 1700 psi.

This invention presents unexpected and surprising results in that while the dielectric fuses and therefore undergoes a degree of flow, the flow is insubstantial and will not adversely effect circuit layer orientation and layer-to-layer alignment. Thus, precision multi-layer circuit may be made from the method of this invention.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of making a multilayer circuit comprising the steps of:

providing at least two circuit boards wherein said first circuit board comprises a first substrate of fusible dielectric material and a first conductive circuit formed thereon and said second circuit board comprises a second substrate of fusible dielectric material and a second conductive circuit formed thereon and wherein at least said first conductive circuit includes fusible conductive material provided on at least one selected location thereof;

stacking said at least two circuit boards one on top of the other so that said fusible conductive material on said first circuit aligns with a selected location on said second circuit;

laminating said stacked circuit boards under heat and pressure effective to fuse both said fusible dielectric material and said fusible conductive material so as to form a cohesive multilayer circuit having a solid conductive interconnect between said first and second circuits, said solid conductive interconnect being defined by said fusible conductive material.

2. The method of claim 1 wherein at least one of said two circuit boards are formed using the steps of:

forming a circuit pattern;

forming a fusible dielectric substrate having opposed first and second surfaces, said circuit pattern being located on said first surface of said substrate;

forming at least one access opening through said second surface of said substrate to expose a selected location on said circuit pattern;

filling said access opening with conductive material wherein at least an upper portion of said filled access opening comprises fusible conductive material.

3. The method of claim 2 wherein:

a lower portion of said access opening comprises non-fusible conductive material.

4. The method of claim 2 including the step of:

forming said circuit pattern on a mandrel prior to forming said dielectric substrate on said circuit pattern.

5. The method of claim 4 including the step of:

removing the mandrel subsequent to filling the access opening with conductive material.

6. The method of claim 1 including the step of:

forming said fusible conductive material as a plug in a sheet of fusible dielectric material which is sandwiched between said two circuit boards.

7. The method of claim 1 wherein:

said access opening is formed by at least one of the opening formation techniques selected from the group consisting of laser drilling, mechanical drilling, plasma etching and ion etching.

8. The method of claim 1 wherein:

said fusible dielectric material comprises a fluoropolymeric material.

9. The method of claim 8 wherein:

said fluoropolymeric material comprise a polytetrafluoroethylene based material.

10. The method of claim 1 wherein:
said fusible conductive material comprises a metal or metal alloy.

11. The method of claim 10 wherein:
said fusible conductive material has a melting point of less than 900° F.

12. The method of claim 1 wherein said heat is in the temperature range of 620° to 800° F.

* * * * *